US006566888B1

(12) United States Patent
Bruce et al.

(10) Patent No.: US 6,566,888 B1
(45) Date of Patent: May 20, 2003

(54) REPAIR OF RESISTIVE ELECTRICAL CONNECTIONS IN AN INTEGRATED CIRCUIT

(75) Inventors: Michael R. Bruce, Austin, TX (US); Glen Gilfeather, Del Valle, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/833,250

(22) Filed: Apr. 11, 2001

(51) Int. Cl.[7] ........................ G01R 31/08; G01R 31/02; H01L 23/48; H01L 21/66

(52) U.S. Cl. ....................... 324/525; 324/760; 257/773; 438/18

(58) Field of Search ................................ 324/525, 760, 324/765, 752; 438/151, 308, 18; 257/529, 72, 530, 773

(56) References Cited

U.S. PATENT DOCUMENTS 5,883,437 A * 3/1999 Maruyama et al. ......... 257/529
6,136,625 A * 10/2000 Nakazawa .................. 438/151

* cited by examiner

*Primary Examiner*—Christine Oda
*Assistant Examiner*—James C Kerveros

(57) ABSTRACT

The present invention is directed to the repair of resistive circuitry in an integrated circuit die having a multitude of circuit paths. According to an example embodiment of the present invention, a semiconductor die having a resistive electrical connection is analyzed. The location of a circuit portion in the die having a resistive electrical connection is identified. Using the identified location, the resistive circuit portion is annealed and the resistivity of that circuit portion is reduced. The reduced resistivity improves the ability of the die to operate at high speeds, and makes possible the repair and subsequent use of the die in various applications.

23 Claims, 4 Drawing Sheets

450
424
CONTROLLER
LASER
HEAT SOURCE
420
460
400
412
DIE
DIE PLATFORM
ANALYSIS ARRANGEMENT
414

REPAIR OF RESISTIVE ELECTRICAL CONNECTIONS IN AN INTEGRATED CIRCUIT

FIELD OF THE INVENTION

The present invention relates generally to semiconductor devices and their fabrication and, more particularly, to the repair of semiconductor devices.

BACKGROUND OF THE INVENTION

The electronics industry continues to rely upon advances in semiconductor technology, including integrated circuits (ICs), to realize higher-functioning devices in more compact areas. For many applications, realizing higher-functioning devices requires integrating a large number of electronic devices into a single silicon wafer. In addition, many of the individual devices within the wafer are being manufactured with smaller physical dimensions. As the number of electronic devices per given area of the silicon wafer increases, and as the size of the individual devices decreases, testing processes become more important and more difficult.

Many integrated circuit dies include circuits having defects that can hinder the operability and reliability of the die. One such defect that can cause difficulty is a resistive electrical connection. Resistive connections have been a major IC manufacturing and operating problem in terms of yield, performance, and reliability, and this problem is expected to increase in importance as the number of interconnection levels and operating frequencies increase. While the ability to localize and identify these defective interconnections can be extremely useful for diagnosing IC failures and implementing corrective action, ICs exhibiting such defects often are not usable due to operating problems including those noted hereinabove. In many cases, these ICs cannot be operated at design performance levels, and in some cases the ICs must be discarded due to the inability to assure adequate performance.

SUMMARY OF THE INVENTION

The present invention is exemplified in a number of implementations and applications, some of which are summarized below. According to an example embodiment of the present invention, a semiconductor die having circuitry that includes a multitude of circuit paths is analyzed. A circuit portion exhibiting resistivity is detected and annealed to reduce the resistivity of the circuit portion and improve the ability of the die to process high speed signals. In this manner, the repair of ICs exhibiting operational problems due to resistive electrical connections, such as those discussed hereinabove, is made possible.

According to another example embodiment of the present invention, a system is adapted for repairing a semiconductor die having circuitry that includes a multitude of circuit paths. The system includes a resistivity detection arrangement adapted to detect that a particular circuit portion in the die is resistive. An annealing arrangement, such as a laser adapted to generated heat in the die, is adapted to anneal the resistive circuit portion and reduce the resistivity therein.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
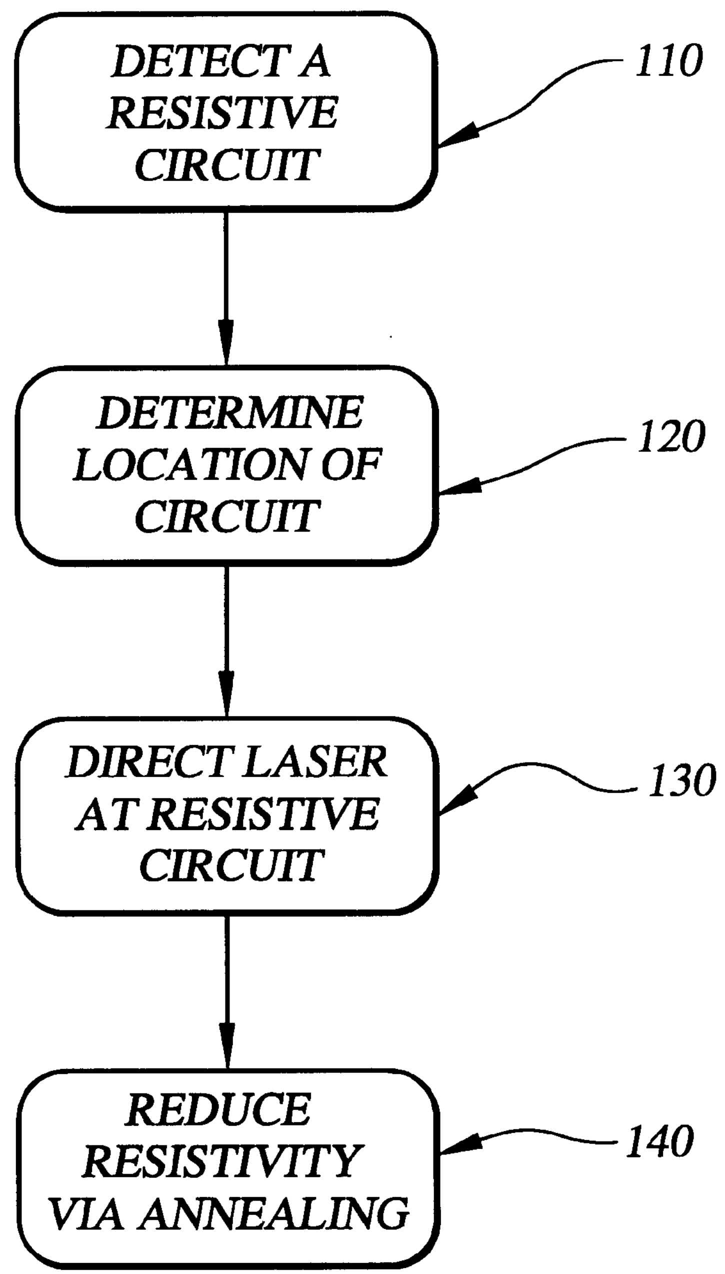
FIG. 1 is a flow diagram for analyzing a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for dies susceptible to failure due to undesired changes of resistivity. As will be discussed below, among other failures of this type, these failures include conductive vias becoming more resistive in some instances, less resistive in other instances, and shorts and opens. While the present invention is not necessarily limited to such applications, various aspects of the invention may be appreciated through a discussion of various examples using this context.

According to an example embodiment of the present invention, the resistivity of an integrated circuit die having suspect circuitry that includes a multitude of circuit paths is analyzed. A circuit path exhibiting an electrically resistive connection is identified. It has been discovered that the resistivity of the resistive connection can be reduced via laser annealing. A laser is directed to the resistive connection and used to sufficiently heat the connection to anneal and thereby reduce the resistivity therein. In one implementation, the heat added by the laser causes the resistive connection to re-flow as part of the annealing process. Annealing and/or re-flowing the resistive connection is particularly useful for improving the operability and/or effecting the repair of one or more circuit paths in a semiconductor die that exhibit a resistive defect, such as by improving signal propagation speed through critical timing path circuitry having a resistive defect. For example, the annealing and/or re-flowing of the connection can change the crystalline structure of the circuitry, thereby improving its conductivity. In addition, re-flow can cause circuitry around a gap or void to flow into the gap or void and form a continuous connection. The reduction in resistivity is applicable to dies including those having multi-level interconnects and vias, and those having various configurations, such as flip-chip, silicon on insulator (SOI), and conventional configurations.

The circuit path may be identified in a variety of manners. In a more particular example embodiment of the present invention, the circuit path exhibiting an electrically resistive connection is identified in the manner disclosed in U.S.

patent application Ser. No. 09/586,518, (AMDA.455PA/TT3843), entitled "Resistivity Analysis" and filed on Jun. 2, 2000, which is incorporated herein by reference. Once identified, the resistive connection is repaired as described herein.

The repair of such resistive interconnects is useful for reducing the incidence of operations failures. Operational failures can occur, for example, when an IC is operated at a clock frequency that is too high, or when one or more circuit elements within the IC produce an excessive or unaccounted for signal delay in switching in a transistor, or in propagating a signal along a path. Operational failures can also occur when the IC is powered by a power supply voltage or current which is outside a range for which the IC has been designed, or when the IC is operated at a temperature outside a normal operating range for the IC. Operational failures can arise as a result of particular operating conditions for the IC even though the IC operates within specifications under other operating conditions. Thus, an operational failure can result from suboptimal performance of particular circuit elements in the IC which produce timing errors.

One example such operational failure results when an electrical signal arrives at a destination too early or too late, resulting in an incorrect value of an output state of the IC. Circuit elements that can be involved with such failures include, for example, switching transistors or functional circuit blocks that switch between logic states at a rate that is slower than normal, and interconnections in the IC which have a resistance larger than an expected value. In general, anything within an IC that results in or contributes to a particular signal within the IC being advanced or delayed in propagation by one or more clock cycles, compared with the time at which the signal should appear, can result in an operational failure in the IC. By reducing and/or repairing the interconnections having a higher resistance than design value, operational failures related to resistivity-related timing delays are sufficiently inhibited and the reliability and functionality of the die is improved.

In one particular example embodiment of the present invention, a resistive interconnect in the die is annealed using a laser. The laser is used to heat a portion of the semiconductor die, for example, by raster scanning the laser beam across the die, stepping the beam across the die, pulsing the laser, or directing the laser in a spot mode at a selected portion of the die. If beneficial, additional heat sources such as peltier tape, heating elements and conventional heaters are used in combination with the laser to heat the die. Cooling devices, such as a thermoelectric module, a refrigeration system or a flow of gas, may also be employed to regulate the heating rate of the die. In one particular implementation, a portion of the die that includes the resistive interconnect is heated, and the laser is used to add heat directly to the resistive interconnect and to raise the resistive interconnect to a sufficient temperature for annealing. The heat added by the laser effects the annealing in the portion of the die having the resistive interconnect while other portions of the die remain at a lower temperature.

The amount of heat added to the die is selected based on experimentation and known parameters of the specific die being repaired. For example, defective interconnects having tungsten-aluminum (W—Al) metallization are annealed when heated to about 400 degrees Celsius. In one particular implementation, a flip-chip die exhibiting about 3% absorption at the resistive interconnect is heated to about 400 degrees Celsius using a near-infrared (nIR) laser of about 1 Watt and 14 C/mW focused onto a 0.5 micrometer spot via a front side of the die. In another particular implementation, a laser having similar characteristics of that of the one used above via the front side of the die is used via back side of the flip chip die. With the back side exhibiting about a 1% transmission of the laser, the power is increased to about 100 Watts and sufficient heating is achieved to cause annealing of the resistive circuitry. In still another implementation, a semiconductor die having SOI structure is repaired, wherein a laser having a power of about 10 Watts is directed at the defective portion of the die via the insulator of the SOI structure.

In another example embodiment of the present invention, substrate is removed from the die prior to the laser being used to anneal and/or re-flow a resistive interconnect in the die. Various applications of this example embodiment involve removing substrate from one or more portions of the die as needed to sufficiently access, heat and repair the resistive connection. For example, in a flip-chip type die, substrate in the back side can be removed prior to directing the laser via the back side at the resistive connection. The substrate removal may, for example, include global or local removal of various portions of the die. In one implementation, the laser used to repair the die is also used to effect the substrate removal. Other implementations involve the use of conventional substrate removal processes, such as chemical-mechanical polishing (CMP), etching with a laser and/or a focused ion beam (FIB) and masking with subsequent etching. Substrate removal is useful for improving the transmission of the laser to the defect and thereby improving the heating and related repair of the defect. Once the defect is repaired, substrate is deposited to replace the substrate that was removed.

FIG. 1 is a flow diagram depicting the repair of an integrated circuit die having a resistive circuit defect, according to another example embodiment of the present invention. At block 110, a resistive circuit in the die is detected. The die is analyzed and the location of the resistive circuit is determined at block 120. The location may be determined, for example, using one or more methods and/or arrangements as described in U.S. patent application Ser. No. 09/586,518, entitled "Resistivity Analysis" and filed on Jun. 2, 2000. For instance, in one implementation, a portion of state-changing circuitry in the die having a signal path site suspected of having a defect is heated to cause a failure due to circuitry having a resistive defect. A state-changing transition between a failed mode and a recovered mode in the suspected defective path site is detected and used to determine the location of the defect. Once the location is determined, regardless of how that determination is made, a laser is directed at the resistive circuit at block 130. The laser is used to heat the portion of the die at the resistive circuit, and the heat reduces the resistivity of the circuit via annealing at block 140.

Figure 2:
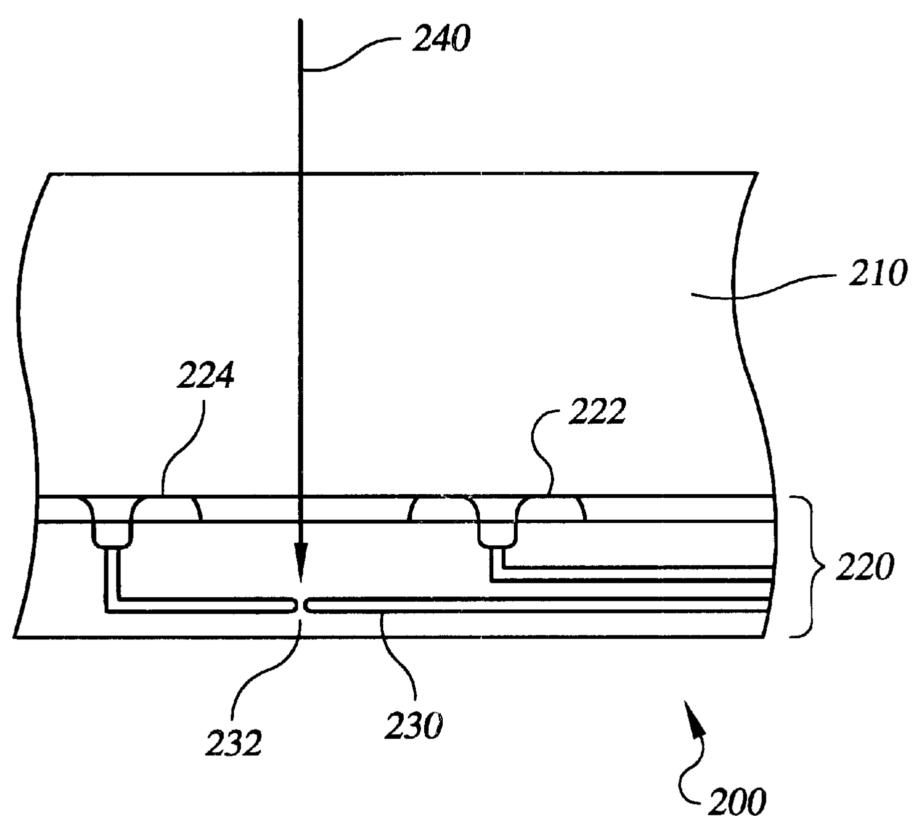
FIG. 2 is a semiconductor die having a resistive via undergoing repair, according to another example embodiment of the present invention.

FIG. 2 shows a semiconductor die 200 undergoing laser annealing and re-flow, according to another example embodiment of the present invention. The die has a circuit side 220 opposite a back side 210. Circuitry 222 and 224 are located in the circuit side and coupled to other portions of the die via interconnects. Interconnect 230 includes a resistive portion 232. The resistive portion can cause delays in timing and other defects due to increased resistivity of that portion of the interconnect as compared to an interconnect not having such a defect. Laser light 240 is directed at the resistive interconnect 232. The laser light has sufficient power to penetrate through the back side 210 and reach the resistive interconnect. Laser light suitable for such an application includes, for example, laser light generated by a near-infrared (nIR) laser having about 100 Watts of power using a wavelength of about 1300 nanometers. The laser heats the portion of the die including the resistive interconnect and reduces the resistivity thereof.

Figure 3:
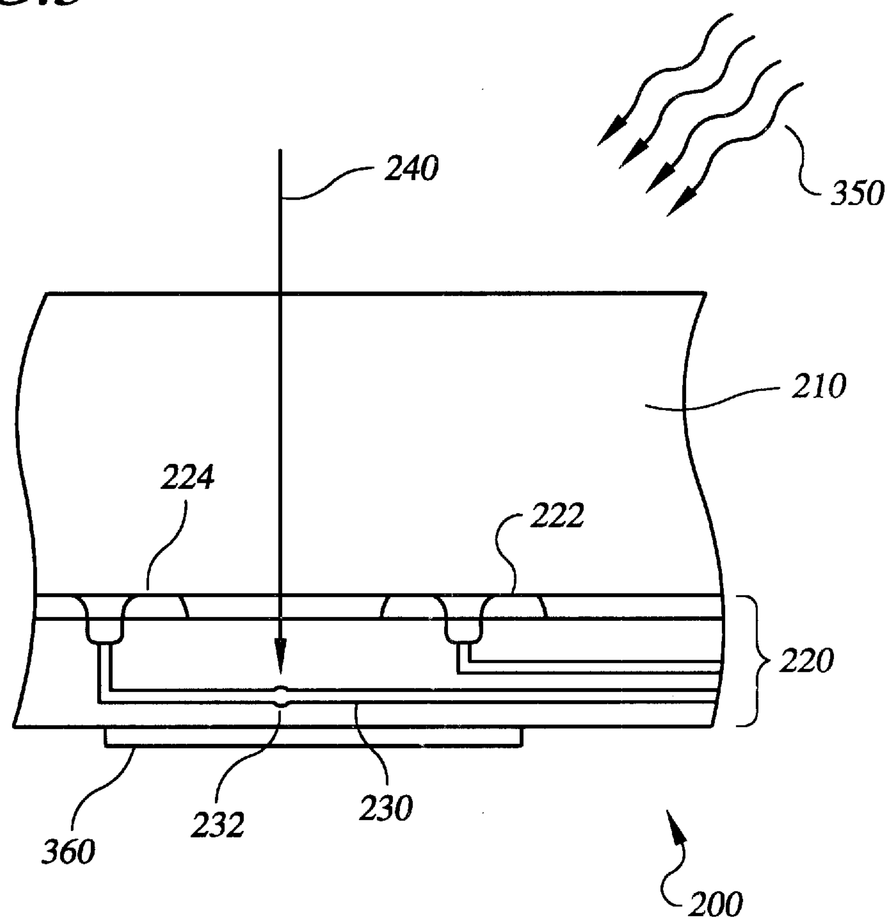
FIG. 3 is the semiconductor die of FIG. 2 at a further state of repair, according to another example embodiment of the present invention.

In a more particular example embodiment of the present invention, FIG. 3 shows the die of FIG. 2 wherein the die has been heated enough to cause the interconnect 232 to re-flow and effects a repair of the interconnect via the re-flow. FIG. 3 also shows optional heating 350 being supplied via an external heat source, such as by a convective or radiative heat source. In addition, a heat tape 360 is applied in selected applications where heat in addition to that supplied by the laser is desired.

Figure 4:
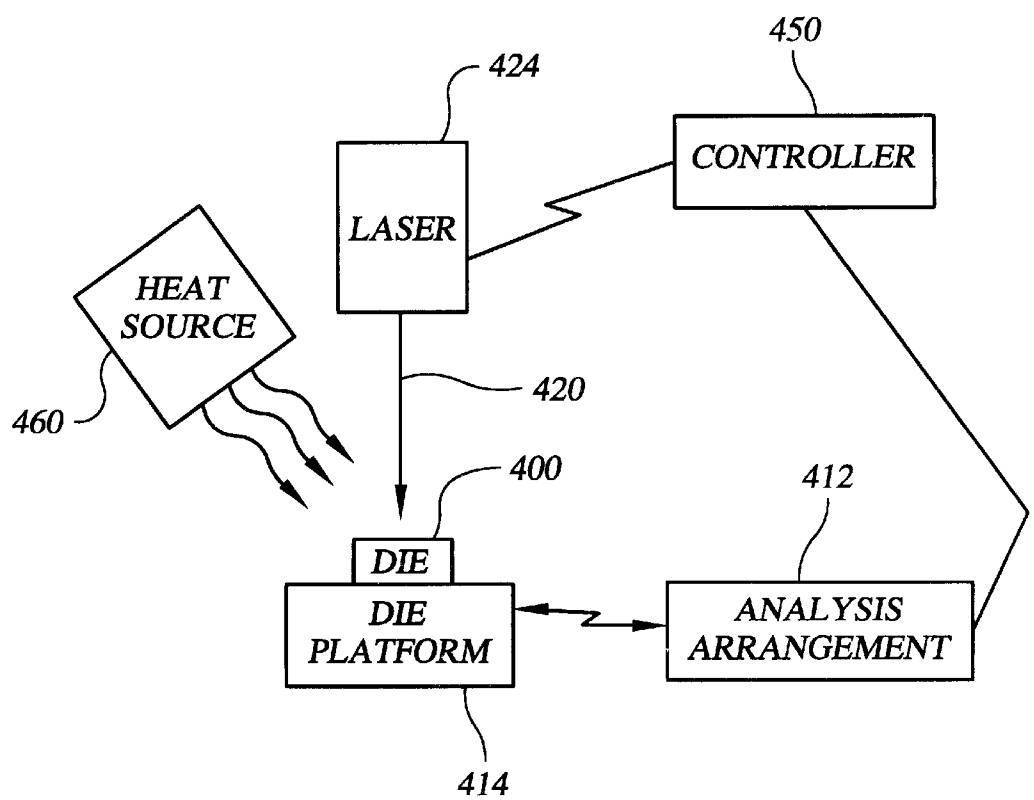
FIG. 4 shows a system for analyzing a semiconductor device, according to another example embodiment of the present invention.

In still another example embodiment of the present invention, FIG. 4 shows a system adapted for repairing a defective semiconductor die having resistive circuitry, according to another example embodiment of the present invention. A die 400 is located on a die platform 414. An analysis arrangement 412 is adapted to detect and locate a defect in the die including a resistive circuit connection. Information regarding the location of the defect is communicated to a controller 450. The controller 450 is used to control a laser 424 to direct a laser beam 420 at the portion of the die having the defect. In selected applications, the laser is used to both assist in locating the defect and in repairing the die. The laser may include, for example, a femtosecond laser, a nIR laser, or other laser adapted to generate heat in the die.

The laser 424 is adapted to sufficiently heat the resistive interconnect in a manner that causes the interconnect to be annealed and, in a particular implementation, is adapted to sufficiently heat the resistive interconnect to cause the interconnect to re-flow. For example, when it is desired to heat the defect to a selected temperature, the controller 450 is adapted to operate the laser in a manner that produces the selected temperature, such as by pulsing the laser or scanning the laser. The temperature of the defect is detected and monitored using one or more conventional temperature monitoring techniques, such as via using a thermocouple, an infrared temperature sensor, or other devices commonly available. In another particular implementation, a heat source 460 is adapted to direct heat at the die and to assist the laser in creating sufficient heat at the defect to repair the die.

While the present invention has been described with reference to several particular example embodiments, those skilled in the art will recognize that many changes may be made thereto without departing from the spirit and scope of the present invention, which is set forth in the following claims.

What is claimed is:

1. A method for repairing a semiconductor die having circuitry that includes a multitude of circuit paths, the method comprising:

detecting a state-changing transition between a failed mode and a recovered mode in a suspect signal path site;

using the detected state-changing transition, determining that the suspect signal path site has a resistivity that changes between the failed mode and the recovered mode; and annealing a resistive circuit portion including the suspect signal path site and reducing the resistivity therein.

2. The method of claim 1, further comprising:

heating at least a selected portion of state-changing circuitry in the semiconductor die to cause a failure due to suspect circuitry, the state-changing circuitry including the suspect signal path site, wherein determining that the suspect signal path site has a resistivity that changes between the failed mode and the recovered mode comprises detecting that the suspect signal path site has a resistivity that changes in response to the selected portion being heated.

3. The method of claim 2, wherein heating at least a selected portion of state-changing circuitry in the semiconductor die includes scanning the die with a laser; and wherein annealing the resistive circuit portion includes focusing the laser upon the resistive circuit portion and heating the resistive circuit portion with the laser.

4. The method of claim 2, wherein heating at least a selected portion of state-changing circuitry includes heating logical circuitry that changes logical states and wherein detecting a state-changing transition between a failed mode and a recovered mode in a suspect signal path site includes detecting a logical state change of the logical circuitry.

5. The method of claim 1, further comprising thinning the die prior to the annealing.

6. The method of claim 1, wherein annealing the resistive circuit portion includes directing a laser at the resistive circuit portion.

7. The method of claim 6, wherein the circuitry in the die is located in a circuit side of the die that is opposite a back side of the die, and wherein the laser is directed via the circuit side of the die.

8. The method of claim 6, wherein the circuitry in the die is located in a circuit side of the die that is opposite a back side of the die, and wherein the laser is directed via the back side of the die.

9. The method of claim 6, wherein the laser is adapted to sufficiently heat the resistive circuit portion to anneal the circuitry and reduce the resistivity thereof.

10. The method of claim 6, further comprising re-flowing the resistive circuit portion with the laser.

11. The method of claim 10, wherein re-flowing the resistive circuit includes connecting two circuit portions and reducing the resistivity therein.

12. The method of claim 6, wherein directing a laser at the resistive circuit portion includes directing the laser through substrate in the die and focusing the laser upon the resistive circuitry.

13. The method of claim 12, wherein directing a laser at the resistive circuit portion includes directing a femtosecond laser at the resistive portion.

14. The method of claim 6, wherein annealing the resistive circuit portion includes heating the resistive circuit portion with the laser to about 400 degrees Celsius.

15. The method of claim 6, wherein the die includes SOI structure, and wherein directing a laser at the resistive circuit portion includes directing the laser through the insulator portion of the SOI structure.

16. The method of claim 6, wherein directing a laser at the resistive circuit portion includes directing a laser having sufficient power to penetrate the die to heat the resistive circuit portion.

17. The method of claim 1, wherein annealing the resistive circuit portion includes improving signal propagation speed through the circuit portion in the die.

18. The method of claim 1, wherein annealing the resistive circuit portion includes annealing a circuit portion located in a critical timing path of a signal passing through the die.

19. The method of claim 1, wherein detecting a state-changing transition includes detecting a transition in the logical state of logical circuitry.

20. A system for repairing a semiconductor die having circuitry that includes a multitude of circuit paths, the system comprising:

means for detecting a state-changing transition between a failed mode and a recovered mode in a suspect signal path site;

using the detected state-changing transition, means for determining that the suspect signal path site has a resistivity that changes between the failed mode and the recovered mode; and means for annealing a resistive circuit portion including the suspect signal path site and reducing the resistivity therein.

21. A system for repairing a semiconductor die having circuitry that includes a multitude of circuit paths, the system comprising:

a detection arrangement adapted to detect a state-changing transition between a failed mode and a recovered mode in a suspect signal path site for determining that the suspect signal path site has a resistivity that changes between the failed mode and the recovered mode; and an annealing arrangement adapted to anneal a resistive circuit portion including the suspect signal path site and reduce the resistivity therein.

22. The system of claim 21, wherein the annealing arrangement includes at least one of: a laser, a heating element and a peltier tape.

23. The system of claim 21, wherein the detection arrangement is further adapted to heat at least a selected portion of state-changing circuitry in the semiconductor die to cause a failure related to the state-changing transition, the state-changing circuitry including the suspect signal path site.

* * * * *